United States Patent
Landry et al.

(10) Patent No.: US 8,067,259 B2
(45) Date of Patent: Nov. 29, 2011

(54) METHOD OF PRODUCING HIGH PERFORMANCE PHOTOVOLTAIC AND THERMOELECTRIC NANOSTRUCTURED BULK AND THIN FILMS

(75) Inventors: Daniel Landry, Clifton Park, NY (US); Susanthri Perera, Cohoes, NY (US)

(73) Assignee: Evident Technologies, Troy, NY (US)

( * ) Notice: Subject to any disclaimer, the term of this patent is extended or adjusted under 35 U.S.C. 154(b) by 0 days.

(21) Appl. No.: 12/778,511

(22) Filed: May 12, 2010

(65) Prior Publication Data

US 2010/0291724 A1 Nov. 18, 2010

Related U.S. Application Data

(60) Provisional application No. 61/177,325, filed on May 12, 2009.

(51) Int. Cl.
*H01L 21/00* (2006.01)

(52) U.S. Cl. ...... 438/54; 438/57; 977/948; 257/E31.001

(58) Field of Classification Search ............. 438/54, 438/57; 977/948; 257/E31.001
See application file for complete search history.

(56) References Cited

U.S. PATENT DOCUMENTS

| | | | |
|---|---|---|---|
| 7,517,718 B2 | 4/2009 | Mitzi et al. | |
| 7,663,057 B2 * | 2/2010 | Yu et al. | 136/264 |
| 2005/0183767 A1 * | 8/2005 | Yu et al. | 136/263 |
| 2008/0160306 A1 * | 7/2008 | Mushtaq et al. | 428/402 |
| 2009/0288517 A1 * | 11/2009 | Chretien et al. | 75/371 |
| 2009/0301344 A1 * | 12/2009 | Chretien et al. | 106/31.13 |
| 2011/0003086 A1 * | 1/2011 | Chung et al. | 427/555 |
| 2011/0026019 A1 * | 2/2011 | Tyagi et al. | 356/301 |

* cited by examiner

*Primary Examiner* — Alexander Ghyka
*Assistant Examiner* — Stanetta Isaac
(74) *Attorney, Agent, or Firm* — Hoffman Warnick LLC

(57) ABSTRACT

Embodiments of the invention provide methods of forming photovoltaic or thermoelectric materials, including photovoltaic or thermoelectric films. In one embodiment, the invention provides a method of forming a photovoltaic material, the method comprising: depositing an inorganic capped nanoparticle solution onto a substrate; and heating the substrate.

16 Claims, No Drawings

METHOD OF PRODUCING HIGH PERFORMANCE PHOTOVOLTAIC AND THERMOELECTRIC NANOSTRUCTURED BULK AND THIN FILMS

CROSS REFERENCE TO RELATED APPLICATIONS

This application claims the benefit of U.S. Provisional Application No. 61/177,325, filed May 12, 2009, the contents of which are hereby incorporated herein.

FIELD OF INVENTION

The present invention relates to the production of high efficiency photovoltaic and thermoelectric thin and bulk films, utilizing inorganic capped semiconductor nanocrystals.

BACKGROUND OF THE INVENTION

An increasing awareness of energy consumption and environmental issues as well as technology breakthroughs in the area of nanomaterial development has reignited an interest in the use of thermoelectric and photoelectric materials. Thermoelectric materials have properties that allow electricity to be generated from a temperature difference. Photoelectric materials are capable of collecting photons, preferably from a renewable source such as sunlight, and converting that energy into electricity. It is desirable to increase the energy conversion efficiency of these materials and lower the cost to produce thermoelectric and photoelectric materials. Due to the energy conversion efficiency and reduced cost that the present invention will enable, there is a potential to enable new applications of thermoelectric and photoelectric devices. In addition, there is a potential applicability for photocatalysts for hydrogen production, thermionic emitters, and application to fuel-cell membranes.

Thermoelectric Materials

Thermoelectrics is the science and technology associated with thermoelectric converters, that is, the generation of electrical power based on the Seebeck effect and refrigeration by the Peltier effect. The attractive features of thermoelectric devices are their long life time, low maintenance, lack of moving parts, capability to be miniaturized, lack of harmful environmental emissions, and their high reliability. Currently, thermoelectric generators are used to provide electrical power in medical, military and deep space applications where their desirable properties outweigh their relatively high cost and low operating efficiency. In recent years there also has been an increase in applications of thermoelectric coolers for use in infrared detectors, optical communications, and computing. The widespread use of thermoelectric components is presently limited by the low efficiency of presently known materials. The dimensionless thermoelectric figure of merit (ZT) of the best performing thermoelectric materials has remained around 1 for more than 50 years. Recent advances in nanotechnology have pushed the laboratory recorded ZT to 3.5. Currently these high ZT have only been achieved in laboratory scale materials and use very expensive processing techniques which make them unlikely candidates as low cost alternatives to simple waste heat recovery and heat management. Simultaneously, a significant amount of work has been initiated using processes that start with large nanoparticles and hot pressing them to result in a low cost material with room temperature ZTs of 1-1.4. The present invention will enable the production of high ZT materials (ZT>1) at a reduced cost.

To be an effective thermoelectric material, a compound must possess a large Seebeck coefficient, a low resistivity and a low thermal conductivity. Achieving these three properties simultaneously has proven to be a considerable challenge. Conventional thermoelectric materials are bulk solid solution alloys. Numerous bulk materials have been extensively studied for decades and the best known bulk solution alloys have room temperature figures of merit on the order of ZT≈1. It is generally acknowledged that this value of ZT is near the limit for bulk materials and thus, any improvement in ZT beyond this value is not likely.

This upper limit for bulk material ZT is due to the physical interrelationships between the Seebeck coefficient $\alpha$, the thermal conductivity $\kappa$, and the electrical conductivity $p$. An increase in $\alpha$ is generally accompanied by an increase in the resistivity $p$ because of carrier density changes. Furthermore, a decrease in the resistivity implies an increase in the electrical contribution to the thermal conductivity.

It has been demonstrated that highly efficient bulk thermoelectric materials can be produced through engineering material structures at the nanoscale. Although this nanoscale based thermoelectric material is highly efficient in terms of its energy conversion, the cost to produce these structures is prohibitive to all but a few niche market areas. The present invention produces bulk films of nanoscale materials at a low cost and with efficient properties in thermoelectric and, additionally, photovoltaic applications. Heat recovery in automobiles and nuclear power plants, general heating and cooling, and power generation are examples of applications for which thermoelectric technology could be utilized.

Photoelectric Materials

Renewable energy from the sun has great potential in reducing the dependency on fossil fuels while providing a cleaner, non-green house gas producing method of power generation. Photovoltaic (PV) devices that directly convert sunlight into electricity have found great acceptance in niche applications such as remote power for oil pipelines, monitoring stations and satellite power. A number of different device designs exist for photovoltaic cells alone including P-N and P-I-N single or tandem quantum dot (QD) junctions or hot carrier cells, intermediate band solar cells, dye sensitized cells (otherwise known as Gratzel cells), a variety of luminescent and luminescent concentrator cells, and extremely thin absorber (ETA) cells. Efficiency constraints associated with PV technology greatly limits its applicability as a widescale distributed power generation source.

Thus, in most electronic devices utilizing solar power, the limiting feature for overall system efficiency is the PV module efficiency. The PV module efficiency is dependent on the materials and processes used to create the module. Best in class crystalline silicon modules have materials with theoretical limits of 33% efficiency and in production as modules these devices have an efficiency of typically around 15%, thereby making final system efficiencies in the 10-13.5% range. Alternately, successful development of advanced materials with efficiencies approaching 60% that can be mass produced while minimizing the penalty on efficiency during production could result in systems with overall efficiencies in the 50-55% range, and thus yielding a four fold increase in available power for a fixed size module.

Semiconductor nanocrystals, otherwise known as quantum dots are nanometer-scale (nano-scale) structures that are composed of semiconductor materials. Due to the small size of the crystals (typically, 2-10 nanometers (nm)), quantum confinement effects manifest which results in size, shape, and compositionally dependent optical and electronic properties, rather than the properties of the bulk materials. Quantum dots have a tunable absorption onset that has increasingly large extinction coefficients at shorter wavelengths, multiple observable excitonic peaks in the absorption spectra that correspond to the quantized electron and hole states, and narrow-band tunable band-edge emission spectra. Quantum dots absorb light at wavelengths shorter than the modified absorption onset and emit at the band edge.

The semiconductor nanocrystal complexes of the present invention can be adapted and then implemented into PV devices through solution phase self-assembly deposition on substrates and post processing techniques. These techniques are compatible with low-cost, large area metallized polymer substrates using roll-to-roll processing.

In contrast to the limitations of contemporary solar cell technologies, semiconductor nanocrystals, in particular colloidal semiconductor nanocrystals, allow for greatly increased solar cell efficiency as well as significantly decreased manufacturing costs. Because colloidal semiconductor nano crystals can be combined with polymers in solution, most solar cell research has focused on cells comprising semiconductor nanocrystals dispersed within conjugated polymers. Although this route can conceivably lead to low cost solar cells, the efficiency has been limited to a few tens of a percent to a few percent due to difficulties in facilitating charge transport through the quantum dot/conjugated polymer interface. In addition, charge transport is compromised due to voids between the colloidal particles. The present invention enables the production of a bulk film at substantially lower costs than the present PV production methods, with said bulk film exhibiting high PV energy conversion primarily due to filling of the voids between micron-scale composite particles of II-VI, III-V, IV-VI, IV, tertiary, quaternary, and quinary semiconductors with nanocrystals and nanocomposites. Nanocomposites are typically formed by the bonding of a nanocrystal with at least one hydrazine ligand and/or at least one nanoentity. The nanoentity is selected from a group comprising nanoparticles, nanorods, nanotetrapods, and nanowires.

BRIEF SUMMARY OF THE INVENTION

The present invention is a cost-effective method of producing nanocrystalline, highly efficient, thin films and bulk nanostructured materials that can be used for thermoelectric and photovoltaic applications. In one embodiment, bulk thermoelectric materials are produced by sintering micron sized particles containing nanocomposites made from drying and annealing inorganic capped nanoparticles and subsequently grinding these particles into a powere and sintering them together to form a bulk structure with properties of the nanoscale materials.

In another embodiment this invention includes the use of a spraying to deposit micron thick films of nanoparticle capped with inorganic ligands.

DETAILED DESCRIPTION OF THE INVENTION

The semiconductor nanostructured material of embodiments of the present invention is synthesized using a method for generating either a thin film or an ingot for use in a thick film containing nanostructured semiconductor materials. The nanostructured material of embodiments of this invention is generated by first producing a semiconductor nanocrystal ink bonded to inorganic ligands.

Semiconductor nanocrystals used in this invention may be spherical nanoscale crystalline materials, however oblate and oblique spheroids, rods, and other shaped nanocrystals may be utilized. The semiconductor nanocrystals may have a diameter between 1 nm and 100 nm, and may typically but not exclusively be composed of II-VI, III-V, and IV-VI binary semiconductors. Examples of such binary semiconductor materials that nanocrystals are composed of include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, and InSb (III-V materials).

In addition to binary semiconductor nanocrystals, the semiconductor nanocrystals of the present invention may be ternary, quaternary, and quinary semiconductor nanocrystals and combinations and mixtures of the matierials thereof. Semiconductor nanocrystal materials that may work particularly well for certain embodiments of this application include IV-VI and III-V (PbS, PbSe, PbTe, BiS, BiTe, SbTe) based nanoparticles, particularly in the 2 nm-10 nm range, which have a small bandgap in the bulk material, such as 0.27-2.75 eV, covering the majority of the visible and near-IR spectrum.

In order to form the ink, the semiconductor nanocrystals in the present invention may then be bonded to one or more hydrazine ligands to form a hydrazine-inorganic ligand complex, or nanocomposite. Although certain embodiments will use hydrazine as an example ligand, it should be understood to one of ordinary skill in the art that hydrazine may be substituted by other ligands, for example, by DMSO or $NH_4^+$.

The ink may then be used to generate a solid nanostructured material by one of two methods. In one embodiment, the ink material is deposited into a crucible where it is then annealed. Any now known or later developed method of annealing may be used, but in some embodiments, the ink may be annealed using a simple heating technique, wherein the crucible with the ink is put into a furnace. The solid nanostructured material may then be subsequently ground into particles. The particles may be ground based on the application desired, which may be from a few nanometers in size up to hundreds of microns in size. The ground particles may then be sintered together to form a bulk solid, or an ingot of the nanostructured material. This ingot, when annealed correctly, should exhibit the properties of the nanoscale materials, rather than the properties of a typical bulk material of the same components.

For a thick film to be produced from these ingots, the above described process utilizing the crucible is used. However, after the ink is annealed, the solid produced is removed from the crucible and may be ground, or more specifically, micronized. For instance, the annealed solid may be micronized using a ball milling technique or other micronizing technique in order to form a nanostructured powder with particles of substantially uniform size distribution. Alternative grinding or milling techniques such as jet milling are also possible. The powder may be used to form a thick film by depositing the powder onto a substrate. The substrate may be heated before deposition. After deposition, the substrate may be heated or further heated in order to anneal the powder after deposition. Using this method, thick films of more than a micron may be produced.

In an alternative embodiment, the semiconductor nanocrystal ink with inorganic ligands may be sprayed into a thin film using a spraying device. The spraying device may be any now known or later developed sprayer, including for example an artist's airbrush, or for a more controlled thin film, an automated spray deposition device. In one embodiment, the semiconductor nanocrystal ink is sprayed uniformly onto a hot substrate to form a thin film. The substrate may then be further heated, raising the temperature such that the film can be annealed to the desired point. This method results in a uniform thin film of the nanostructured material.

For some embodiments, it is desirable to leave the nanostructure formed by any of the above annealing processes in tact. For instance, annealing at very high temperatures may result in the materials melting together more than intended, which could possibly eliminate the nanoscale properties of the materials, which may result in the bulk material properties dominating. This is true for both the photovoltaic devices, as strong confinement effects allow impact ionization (multiple charge carriers/photon), and for the thermoelectric applications, where nano-enhancement has improved the figure of merit for a material system.

In a further embodiment, the semiconductor nanocrystals bonded to one or more hydrazine ligands may, in addition, be bonded to one or more nanoentities, or quantum dots. The nanoentities may comprise nanoparticles, nanocrystals, quantum dots, nanorods, nano-tetrapods, nanowires and the like, with the structure in its entirety called a nanocomposite. The addition of the nanoentity to the hydrazine-inorganic ligand complex can provide an additional degree of electronic and structural flexibility.

Specifically, the nanoentity provides another avenue to tune the thermal and electronic properties of the resulting film by varying the size, type and quantity of nanoentities, thus altering the overall properties of the materials. Furthermore, these nanoentities can be further modified themselves by utilizing a core-shell structure. The shell can allow for the resultant film or ingot to maintain the quantum confinement effects of the core material of the nanoentity, while still being heated enough to anneal the materials into a solid conducting film, as the shell may anneal leaving the cores in tact.

As an additional embodiment, the inorganic capped nanoparticle can be combined with micron-scale nanostructured semiconductor particles. These micronized particles are generated using the methods above of casting the nanostructured ink in a crucible and annealing it into a solid matrix, and then micronizing using the milling techniques described above. These micronized nanostructured particles are added to the inorganic capped nanoparticles in the original ink, which may then be hot pressed and sintered together into an ingot. The addition of the inorganic capped nanoparticle ink to the micronized particle facilitates a sintering of the materials which are annealed together. When combined like this, the annealing process volatilizes the hydrazine ligands of the ink, which melts the nanocrystals and/or nanocomposites, either partially or completely. Then these liquid phase nanocrystals and/or nanocomposites may act like a glue that binds the micron-scale semiconductor particles together by filling in any pores or voids which would otherwise have existed between the micronized particles being annealed together. Thus, the ink sinters the micronized particles together during the annealing process.

The inorganic capped semiconductor nanoparticle particles described for all embodiments are comprised of II-VI, III-V, IV-VI, IV, tertiary, quaternary, and quinary semiconductors including, but not limited to, ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials), SiGe, PbSeTe, $Bi_2Te_3$, $Bi_2Ti_3$, $Sb_2Te_3$, $Bi_2Se_3$, $PbSe_xTe_{1-x}$, (where x represents the fraction of PbSe in the alloy of PbTe and PbSe, and can be between 0 and 1), PbSn, alloys of the above compounds, $Tn_xCO_4Sb_{12}(0<x<1)$, $Na_yCoO_2$ (y=0.2 to 1), and $Bi_xSb_yTe$. The inorganic ligand cap may be chosen from the same list of materials, however not all materials will allow for the formation of the inorganic ligand. Likewise for core/shell nanocrystals the shell structure can be chosen from any of the above materials and may be additionally include metals such as Au, Ag, Pt, Ni, Bi, Sb, or Pb.

Example Synthesis of $(Bi_xSb_{2-x})Te_3$ Thin Films and Ingots
Synthesis of $Bi(oleate)_3$ (Bismuth Oleate Stock)
Oleic acid—20 mL (0.06 mol
$Bi(acetate)_3$—3.86 g (0.01 mol)

Both the oleic acid and bismuth (III)acetate were mixed in a 100 mL three neck flask and heated under vacuum at 120° C. for approximately 2 hours. The resulting bismuth oleate solution was poured into a beaker containing about 50 mL of methanol and stirred using a glass rod. The creamy white solid product was isolated by centrifugation in 50 mL centrifuge tubes. Finally, the precipitate was sonicated in acetone and isolated by centrifugation. The final product was dried in air for two days prior to use.

Preparation of 1 M sulfur oleylamine stock solution
Elemental sulfur—0.32 g
Oleylamine—10 mL The sulfur and oleylamine were both heated together in a 25 ml flask under vacuum at 100° C. until the solution was clear without any residual sulfur. Then the solution was cooled to room temperature before the injection.

Preparation of 1 M Te-hydrazine stock solution
Elemental tellurium—1.276 g (0.01 mol)
Hydrazine—10 mL The tellurium powder and hydrazine were stirred together in a glass vial for about 1-2 days in the glove box. Once the solution turned clear, stirring was stopped and the solution was stored the solution in the glove box.

Preparation of $Sb_2Te_3$–$N_2H_4$ solution ($Sb_2Te_3$:Te=1:4)
Antimony(III)telluride—313.5 mg (0.5 mmol)
1 M Te-hydrazine stock solution—2 mL
Hydrazine—3 mL All materials were stirred together in a glass vial for 4-5 days in the glove box. Once the solution turned clear it was filtered through a 0.25 μm PTFE syringe filter and stored in the glove box.

Synthesis of $Bi_2S_3$ nanorods/particles—in a 100 mL flask
Bismuth Oleate Stock—0.96 g (2 mmol)
Oleic acid—4 mL (12 mmol)
Octadecene—40 mL
1 M Sulfur oleylamine stock solution—4 mL All the reactants were mixed together in a 100 mL round bottom flask and heated under vacuum at 100° C. for 30 minutes. The reaction was then opened to the nitrogen atmosphere and the temperature was raised up to 150° C. Once the reaction temperature stabilized at 150° C., the sulfur solution was injected and the solution was allowed to start cooling immediately using air. At 120° C., 20 mL of anhydrous hexane was injected and the solution continued to cool to room temperature. The product was then precipitated by the addition of ethanol and isolated by centrifugation. The product was cleaned by dissolution in hexane and precipitation by ethanol twice. The final product was dissolved in deaerated toluene, filtered through a 0.25 μm PTFE syringe filter and stored in the glove box.

Synthesis of $(Bi_xSb_{2-x})Te_3$ Ink—Performed in the glove box
$Bi_2S_3$ nanoparticles—529 μL (9 mg of $Bi_2S_3$)
Anhydrous hexane—18 mL
Hydrazine—4.5 mL
$Sb_2Te_3$–$N_2H_4$ solution—225 μL (14 mg of $Sb_2Te_3$)
* The weight ratio between $Sb_2Te_3$:$Bi_2S_3$=1.55:1

6 mL of hexane was mixed into the stirring solution of $Sb_2Te_3$–$N_2H_4$ and hydrazine in a glass vial. Then the $Bi_2S_3$ nanoparticle solution was added slowly into the vigorously stirring $Sb_2Te_3$–$N_2H_4$ solution and continued stirring for another 30 min. Once the top organic layer became clear it was carefully removed and the hydrazine layer was further purified by two more washings with hexane.

Preparation of a Thin Film from the Ink

For a thin film, the ink was transferred into the spraying vial and sprayed using an artists airbrush onto cleaned glass slides at 200° C. The slides were annealed at 300° C. for 15 minutes and cooled to room temperature slowly.

Preparation of an Ingot from the Ink

For a thick film solution, the above material was transferred to a 1 mm×2 mm glass crucible inside a furnace. The furnace temperature was ramped up to 350° C. over a 15 minute period. The resultant solid was removed from the crucible by scraping with a dental tool and the powder was collected. The powder was then put into a ball mill for 2 hours to grind the solid into micron sized particles. Subsequent to grinding, the powder was hot pressed and sintered together to form a 1 mm×1 mm ingot.

The foregoing description of various aspects of the invention has been presented for the purpose of illustration and description. It is not intended to be exhaustive or to limit the invention to the precise form disclosed, and obviously, many modifications and variations are possible. Such variations and modifications that may be apparent to one skilled in the art are intended to be included within the scope of the present invention as defined by the accompanying claims.

What is claimed is:

1. A method of forming a photovoltaic material, the method comprising:
    depositing an inorganic capped nanoparticle solution onto a substrate, wherein the inorganic capped nanoparticle solution includes an inorganic capping ligand attached to a surface of the inorganic capped nanoparticle, the inorganic capping ligand selected from the group consisting of: hydrazine ligands and DMSO; and
    heating the substrate.

2. The method of claim 1, wherein the inorganic capped nanoparticle solution includes a nanocrystal ink bonded to the inorganic ligand.

3. The method of claim 1, wherein the inorganic capped nanoparticle solution includes toluene.

4. The method of claim 1, wherein the substrate is heated prior to the depositing.

5. The method of claim 1, further comprising:
    drying the inorganic capped nanoparticle solution to form a nanostructured solid.

6. The method of claim 5, further comprising:
    removing the nanostructured solid from the substrate.

7. The method of claim 6, further comprising:
    micronizing the nanostructured solid.

8. The method of claim 7, further comprising:
    sintering the micronized nanostructured solid.

9. A method of forming a thermoelectric material, the method comprising:
    depositing an inorganic capped nanoparticle solution onto a substrate, wherein the inorganic capped nanoparticle solution includes an inorganic capping ligand attached to a surface of the inorganic capped nanoparticle, the inorganic capping ligand selected from the group consisting of: hydrazine ligands and DMSO; and
    heating the substrate.

10. The method of claim 9, wherein the inorganic capped nanoparticle solution includes a nanocrystal ink bonded to the inorganic ligand.

11. The method of claim 9, wherein the inorganic capped nanoparticle solution includes toluene.

12. The method of claim 9, wherein the substrate is heated prior to the depositing.

13. The method of claim 9, further comprising:
    drying the inorganic capped nanoparticle solution to form a nanostructured solid.

14. The method of claim 13, further comprising:
    removing the nanostructured solid from the substrate.

15. The method of claim 14, further comprising:
    micronizing the nanostructured solid.

16. The method of claim 15, further comprising:
    sintering the micronized nanostructured solid.

* * * * *